United States Patent [19]
Gardner et al.

[11] Patent Number: 6,121,631
[45] Date of Patent: Sep. 19, 2000

[54] TEST STRUCTURE TO DETERMINE THE EFFECT OF LDD LENGTH UPON TRANSISTOR PERFORMANCE

[75] Inventors: Mark I Gardner, Cedar Creek; Fred N. Hause; H. Jim Fulford, Jr., both of Austin, all of Tex.

[73] Assignee: Advanced Micro Devices, Inc., Sunnyvale, Calif.

[21] Appl. No.: 09/267,444

[22] Filed: Mar. 12, 1999

Related U.S. Application Data

[62] Division of application No. 08/912,446, Aug. 18, 1997, Pat. No. 5,908,315.

[51] Int. Cl.[7] .................... H01L 23/58; H01L 31/119; H01L 27/088
[52] U.S. Cl. .................... 257/48; 257/401; 257/408; 257/900
[58] Field of Search .................... 257/48, 408, 401, 257/336, 900, 296, 341, 342, 344, 390, 391, 392; 438/17, 18, 305, 529, 301, 303, 306, 307, 284, 286, 231

[56] References Cited

U.S. PATENT DOCUMENTS

| | | | |
|---|---|---|---|
| 4,419,809 | 12/1983 | Riseman et al. | 257/401 |
| 5,480,814 | 1/1996 | Wuu et al. | 438/305 |
| 5,716,866 | 2/1998 | Dow et al. | 438/305 |
| 5,804,497 | 9/1998 | Gardner et al. | 438/529 |

*Primary Examiner*—Tom Thomas
*Assistant Examiner*—Hung K. Vu
*Attorney, Agent, or Firm*—Kevin l. Daffer; Conley, Rose & Tayon

[57] ABSTRACT

The present invention advantageously provides a method for forming a test structure for determining how LDD length of a transistor affects transistor characteristics. In one embodiment, a first polysilicon gate conductor is provided which is laterally spaced from a second polysilicon gate conductor. The gate conductors are each disposed upon a gate oxide lying above a silicon-based substrate. An LDD implant is forwarded into exposed regions of the substrate to form LDD areas within the substrate adjacent to the gate conductors. A first spacer material is then formed upon sidewall surfaces of both gate conductors to a first pre-defined thickness. Source/drain regions are formed exclusively within the substrate a spaced distance from the first gate conductor, the spaced distance being dictated by the first pre-defined thickness. A second spacer material is formed laterally adjacent to the first spacer material to a second pre-defined distance. Source/drain regions are then formed within the substrate a spaced distance from the second gate conductor, the spaced distance being dictated by the second predefined thickness. The resulting transistors have a mutual source/drain region between them. More transistors may also be fabricated in a similar manner.

16 Claims, 3 Drawing Sheets

TEST STRUCTURE TO DETERMINE THE EFFECT OF LDD LENGTH UPON TRANSISTOR PERFORMANCE

This is a Division of application Ser. No. 08/912,446, filed Aug. 18, 1997 U.S. Pat. No. 5,908,315.

BACKGROUND OF THE INVENTION

1. Field of the Invention

This invention relates to integrated circuit manufacturing, and more particularly, to fabricating a test structure that may be used to determine the optimum length of lightly doped drains ("LDDs") employed by a transistor, wherein the test structure contains varying LDD lengths for transistors having the same gate length.

2. Description of the Related Art

Fabrication of a MOSFET device is well known. Generally speaking, MOSFETs are manufactured by placing an undoped polycrystalline ("polysilicon") material over a relatively thin gate oxide. The polysilicon material and gate oxide is then patterned to form a gate conductor with source/drain regions adjacent to and on opposite sides of the gate conductor. The gate conductor and source/drain regions are then implanted with an impurity dopant material. If the impurity dopant material used for forming the source/drain regions is n-type, then the resulting MOSFET is an NMOSFET ("n-channel") transistor device. Conversely, if the source/drain dopant material is p-type, then the resulting MOSFET is a PMOSFET ("p-channel") transistor device.

Integrated circuits utilize either n-channel devices exclusively, p-channel devices exclusively, or a combination of both on a single substrate. The methods by which n-channel devices and p-channel devices are formed entail unique problems associated with each device. As layout densities increase, the problems are exacerbated. N-channel devices are particularly sensitive to so-called short-channel effects ("SCE"). The distance between a source-side junction and a drain-side junction is often referred to as the physical channel length. However, after implantation and subsequent diffusion of the junctions, the actual distance between junctions becomes less than the physical channel length and is often referred to as the effective channel length ("Leff"). In VLSI designs, as the physical channel becomes small, so too must the Leff. SCE becomes a predominant problem whenever Leff drops below approximately 1.0 $\mu$m.

A problem related to SCE and the subthreshold currents associated therewith, but altogether different, is the problem of hot-carrier effects ("HCE"). HCE is a phenomena by which the kinetic energy of the carriers (holes or electrons) is increased as they are accelerated through large potential gradients and subsequently become trapped within the gate oxide. The greatest potential gradient, often referred to as the maximum electric field ("Em") occurs near the drain during saturated operation. More specifically, the electric field is predominant at the lateral junction of the drain adjacent the channel. The electric field at the drain primarily causes electrons in the channel to gain kinetic energy and become "hot". As hot electrons travel to the drain, they lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor.

To overcome the problems of sub-threshold current and threshold shift resulting from SCE and HCI, an alternative drain structure known as lightly doped drain ("LDD") is commonly used. The purpose of the LDD is to absorb some of the potential into the drain and thus reduce Em. A conventional LDD structure is one in which a light concentration of dopant is self-aligned to the gate conductor followed by a heavier dopant self-aligned to the gate conductor on which two sidewall spacers have been formed. The purpose of the first implant dose is to produce a lightly doped section within the junction at the gate edge near the channel. The second implant dose is spaced from the channel a distance dictated by the thickness of the sidewall spacer. The second implant dose is the source/drain implant placed within the junction laterally outside the LDD area. Resulting from the first and second implants, a dopant gradient (i.e., "graded junction") occurs at the interface between the source and channel as well as between the drain and channel.

Unfortunately, the addition of an LDD implant adjacent the channel adds capacitance and resistance to the source/drain pathway. This added resistance, generally known as parasitic resistance, can have many deleterious effects. First, parasitic resistance can decrease the saturation current (i.e., current above threshold). Second, parasitic capacitance can decrease the overall speed of the transistor. The deleterious effects of decreased saturation current and transistor speed is best explained in reference to a transistor having conventional source and drain LDDs. Using an n-channel example, the drain resistance $R_D$ causes the gate edge near the drain to "see" a voltage, e.g., less than VDD, to which the drain is typically connected. Similarly, the source resistance $R_S$ causes the gate edge near the source to see some voltage, e.g., more than ground. The drive current along the source-drain path depends mostly on the voltage applied between the gate and source, i.e., $V_{GS}$. If $V_{GS}$ exceeds the threshold amount, the transistor will go into saturation according to the following relation:

$$I_{DSAT} = K/2 * (V_{GS} - V_T)^2$$

where $I_{DSAT}$ is saturation current, K is a value derived as a function of the process parameters used in producing the transistor, and $V_T$ is the threshold voltage. Reducing or eliminating $R_S$ would therefore draw the source-coupled voltage closer to ground and thereby increase the effective $V_{GS}$. From the above equation, it can be seen that increasing $V_{GS}$ directly increases $I_{DSAT}$. While it would seem beneficial to decrease $R_D$ as well, $R_D$ is nonetheless needed to maintain HCI control. Accordingly, a substantial LDD area is required in the drain area Proper LDD design must take into account the need for minimizing parasitic resistance $R_S$ at the source side while at the same time attenuating Em at the drain side of the channel. A well engineered LDD design is necessary to reduce HCI and SCE and to maximize the saturation current of a transistor. It is therefore desirable to derive a transistor test structure that provides for determining the optimum LDD length of a transistor. The thickness of the sidewall spacers employed by a transistor controls the length of the LDDs. Thus, it is important to analyze the effect that varying spacer thickness has on the performance of a transistor. If the spacer is too small, then the corresponding, shortened LDD length might not sufficiently suppress HCI and SCE. Yet, if the spacer width and corresponding LDD length is too large, then parasitic resistance $R_S$ may unduly jeopardize transistor operation. A test structure which can determine optimal LDD length for various processes would greatly enhance the chosen process and/or transistor operation.

SUMMARY OF THE INVENTION

The problems outlined above are in large part solved by the transistor test structure hereof and the method for forming such a test structure. That is, a test structure is provided in which multiple transistors may be formed within a single lateral area, e.g., a single crystalline silicon substrate. The transistors are arranged such that adjacent transistors share a mutual source/drain ("S/D") implant region. The configuration of the transistors allows them to be densely packed within the test structure. The transistor are fabricated such that they have equivalent gate lengths but different LDD lengths. Thus, properties, e.g., saturation current, of all the transistors, may be tested and compared to each other to determine the effect that LDD length has on transistor performance.

Fabrication of the transistors involves forming several layers of material adjacent to sidewall surfaces of the gate conductor of each transistor. Every time a new layer of material is formed, the spacer thickness is increased by the thickness of the new material. The LDD areas are formed within regions of the silicon substrate between the transistors prior to spacer formation. Further, S/D regions are implanted within the substrate adjacent to a different gate conductor each time a new layer is added to increase thicknesses of the spacers. The S/D implant is aligned to the exposed lateral edges of the spacers of the transistor for which S/D regions are being formed. The resulting test structure includes multiple transistors in which the S/D regions are spaced from their corresponding gate conductors by various distances. These distances are dictated by the spacer thicknesses of the transistors at the time that the S/D implant is performed. The LDD areas of each transistor are arranged between the gate conductor and the more heavily doped S/D region. Thus, the variable spacer thicknesses of the transistors cause the LDD areas of the different transistors to vary in length. Each transistor has graded junctions which include S/D regions and LDD areas. The dopant concentration within each graded junction decreases from the S/D region to the LDD area of the junction. Since adjacent transistors share a mutual S/D region, the S/D region may function as the drain for one of the transistor and as the source for the other transistor.

In an embodiment, two gate conductors for two ensuing transistors are provided which are disposed above a silicon-based substrate. This embodiment is only an example, and the test structure may include more than two transistors. Each polysilicon gate conductor is spaced from the substrate by a thin gate oxide. The gate conductors preferably have the same gate length The gate conductors are laterally spaced apart such that portions of the underlying substrate are exposed. Dopants are forwarded into the upper region of the exposed portions of the substrate. The gate conductors act as masks that prevent dopants from entering the channel regions of the transistors below the gate conductors. The dopant dose is pre-selected so that LDD areas are formed within the exposed portions of the substrate between or adjacent to the gate conductors. Subsequently, an insulating material, such as oxide may be deposited across the exposed LDD areas, the opposed sidewall surfaces of the gate conductors, and the upper surfaces of the gate conductors.

A photoresist masking layer is then formed across the second gate conductor. A S/D implant is forwarded into exposed regions of the silicon substrate. The insulating material lying upon the sidewall surfaces of the first gate conductor forms a masking layer adjacent to the gate conductor. The resulting S/D regions are thus aligned to the exposed sidewall surfaces of the insulating material. Portions of the LDD areas which are not dominated by overlapping S/D regions are disposed between the first gate conductor and the S/D regions. One of the S/D regions is also aligned to the photoresist masking layer which terminates between the first and second gate conductor After removing the masking layer, nitride spacers may be formed laterally adjacent to portions of the insulating material which are disposed upon sidewall surfaces of both gate conductors. A photoresist masking layer may then be formed across the first gate conductor. A S/D implant is forwarded into exposed regions of the silicon substrate to align S/D regions to the exposed lateral surfaces of the nitride spacers. The remaining portions of the LDD areas of the second transistor thus become positioned between the S/D regions and the second gate conductor. The lateral thickness of the insulating material and the length of each LDD area of the resulting first transistor are relatively the same. The lateral thickness of the insulating material combined with the thickness of the nitride spacer dictate the length of each LDD area of the resulting second transistor.

BRIEF DESCRIPTION OF THE DRAWINGS

Other objects and advantages of the invention will become apparent upon reading the following detailed description and upon reference to the accompanying drawings in which.

Figure 1:
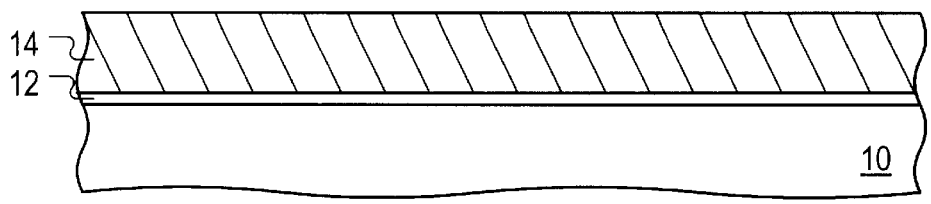
FIG. 1 depicts a cross-sectional view of a semiconductor topography in which an oxide layer is disposed across a silicon-based substrate and a polysilicon layer is disposed across the oxide layer.
Figure 2:
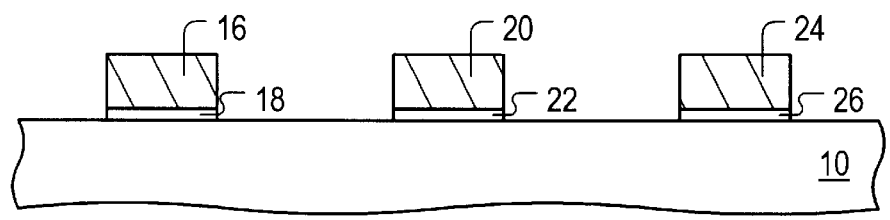
FIG. 2 depicts a cross-sectional view of the semiconductor topography, wherein portions of the oxide layer and the polysilicon layer are removed, thereby forming three gate conductors that are laterally spaced apart.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning to FIG. 1, a single crystalline silicon substrate 10 is provided that has a thermally grown oxide layer 12 disposed across it. A polysilicon layer 14 may be deposited across oxide layer 12 using chemical vapor deposition. According to an embodiment of the present invention, portions of oxide layer 12 and polysilicon layer 14 may be removed using a dry, plasma etch and a photoresist masking layer (not shown). The masking layer may be patterned across portions of polysilicon layer 14 using optical lithography. Portions of polysilicon layer 14 and oxide layer 12 that are not covered by the masking layer undergo etching. Etch duration is chosen to terminate after pre-selected portions of polysilicon layer 14 and oxide layer 12 have been removed down to the surface of substrate 10. Three polysilicon gate conductors 16, 20, and 24 result that are laterally spaced apart within the same horizontal plane. Gate conductors 16, 20, and 24 are disposed above substrate 10 by gate oxides 18, 22, and 26, respectively.

Figure 3:
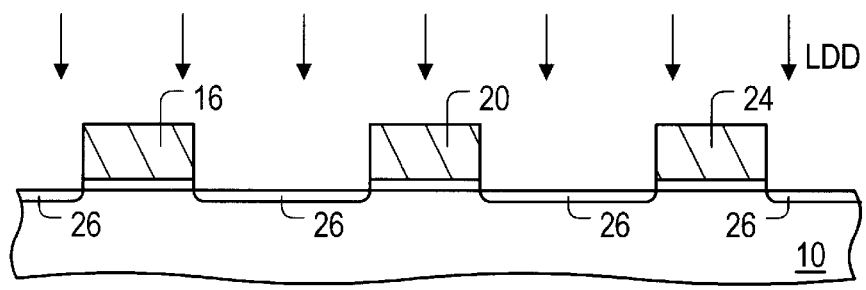
FIG. 3 depicts a cross-sectional view of the semiconductor topography, wherein an LDD implant is forwarded into exposed regions of the substrate.
Figure 4:
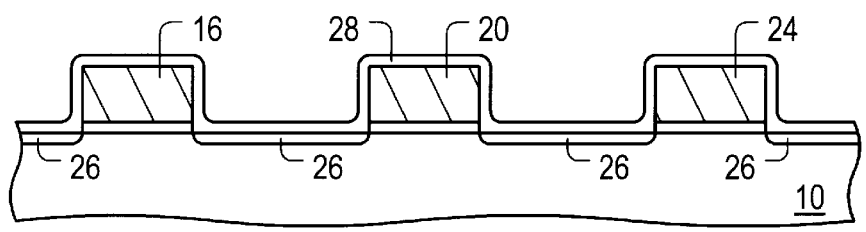
FIG. 4 depicts a cross-sectional view of the semiconductor topography, wherein an oxide layer is deposited across the gate conductor and the exposed regions of the substrate.

FIG. 3 illustrates LDD areas 26 being formed in upper regions of exposed portions of silicon substrate 10. The LDD implant is aligned to the sidewall surfaces of the gate conductors such that LDD areas 26 exist between and/or adjacent to gate conductors 16, 20, and 24. As shown in FIG. 4, an insulating material 28, e.g., oxide, may be deposited using chemical vapor deposition across gate conductors 16, 20, and 24 and LDD areas 26. Insulating material 28 may be formed to a certain thickness adjacent to the sidewall surfaces of the gate conductors, resulting in sidewall spacers. Preferably, the thickness of insulating material 28 is about 50 to 300 Å. Thus, material 28 may later function as a masking layer over portions of substrate 10.

Figure 5:
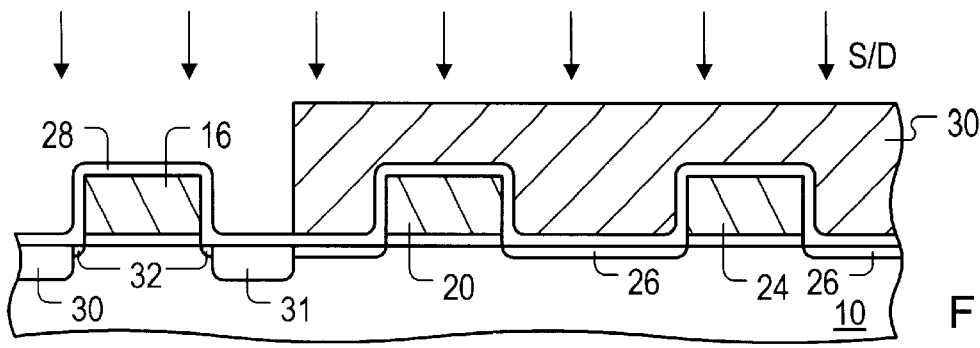
FIG. 5 depicts a cross-sectional view of the semiconductor topography, wherein a S/D implant is forwarded exclusively into regions of the substrate that are a spaced distance from the first gate conductor, thereby forming S/D regions therein.

Turning to FIG. 5, a photoresist masking layer 30 may be patterned across the second and third gate conductors 20 and 24. Masking layer 30 extends from a predetermined position between gate conductor 16 and gate conductor 20 to beyond gate conductor 24. A S/D implant is forwarded into regions of substrate 10 hat do not have a thick layer of material 30 lying above them. Thus, the S/D implant is self-aligned to the exposed lateral edges of portions of insulating material 28 that are disposed upon the sidewall surfaces of gate conductor 16. Further, the S/D implant is aligned to the edge of masking layer 30 that terminates between gate conductor 16 and gate conductor 20. The resulting S/D regions 30 and 31 are a spaced distance from gate conductor 16. This spaced distance is dictated by the thickness of insulating material 28. S/D regions 30 and 31 overlap previously formed LDD areas that are spaced from gate conductor 16. The overlapping region is dominated by the more heavily doped SD regions 30 and 31 so that DD areas 32 only exist between S/D regions 30 and 31 and gate conductor 16. The length of each LDD area 32 is equivalent to the thickness of insulating layer 28 since layer 28 forms spacers adjacent to gate conductor 16.

Figure 6:
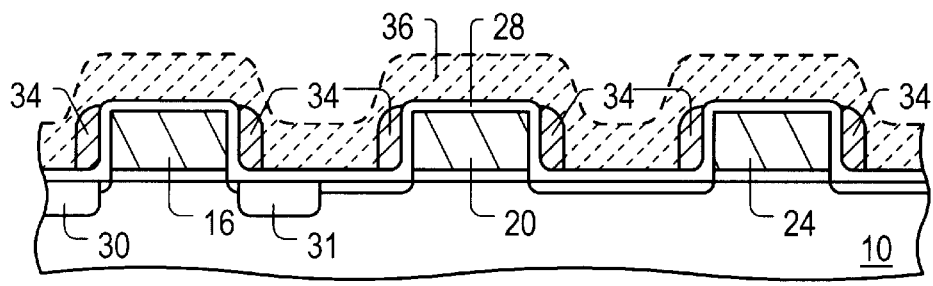
FIG. 6 depicts a cross-sectional view of the semiconductor topography, wherein nitride is formed laterally adjacent to portions of the oxide layer that are disposed upon the sidewall surfaces of the gate conductors.

FIG. 6 depicts the formation of spacers 34 laterally adjacent to portions of insulation layer 28 that are disposed upon sidewall surfaces of gate conductors 16, 20, and 24. Prior to the formation of spacers 34, masking layer 30 is stripped from the semiconductor topography. Spacers 34 result from the deposition of an insulating material that is different from material 28, such as nitride across an oxide-based insulating material 28. A portion 36 of the spacer material is then removed using anisotropic etch in which ion-assisted, physical ablation occurs faster in a vertical direction (perpendicular to the surface topography) than in a lateral direction (across the surface topography). Etch duration is selected to remove (i.e., clear) portion 36 from substantially horizontal surfaces. Preferably, the thickness of each of the spacers 34 is about 100 to 500 Å.

Figure 7:
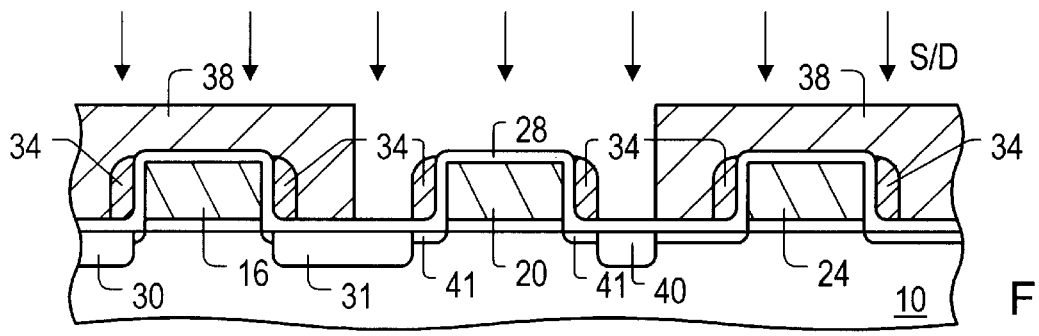
FIG. 7 depicts a cross-sectional view of the semiconductor topography, wherein a S/D implant is forwarded exclusively into regions of the substrate that are a spaced distance from the second gate conductor, thereby forming SID regions therein.

As illustrated in FIG. 7, a photoresist masking layer 38 is patterned across first gate conductor 16 and third gate conductor 24. A portion of the masking layer 38 extends to a pre-selected distance beyond spacers 34 of the first and third gate conductors. S/D implants are forwarded into the exposed portions of substrate 10, resulting in S/D regions that aligned to the exposed lateral edges of the spacers 34 in close proximity to gate conductor 20. One of these S/D regions overlaps into the previously formed S/D region 31 between gate conductor 16 and gate conductor 20. Thus, the area occupied by S/D region 31 is laterally extended such that region 31 becomes a mutual S/D region shared by two transistors. The other S/D region 40 extends laterally from one of the spacers 34 of gate conductor 20 and terminates before reaching one of the spacers 34 of gate conductor 24. LDD areas 41 thus become disposed within substrate 10 between S/D region 31 and gate conductor 20 as well as between S/D region 40 and conductor 20. The length of each LDD area 41 is dictated by the thickness of insulating material 28 combined with the thickness of spacer 34.

Figure 8:
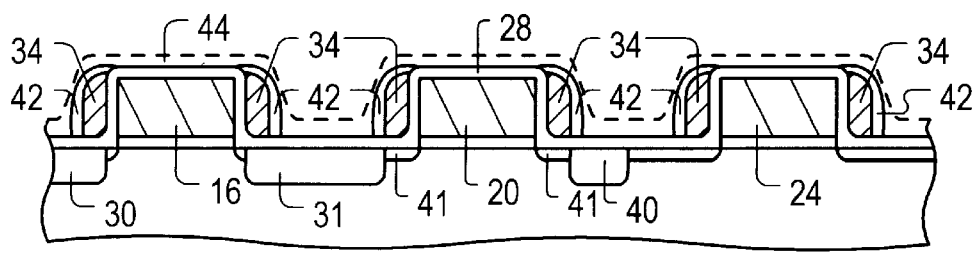
FIG. 8 depicts a cross-sectional view of the semiconductor topography, wherein oxide is formed laterally adjacent to the nitride, thereby increasing the thickness of the spacers that extend from the sidewall surfaces of the gate conductors.
Figure 9:
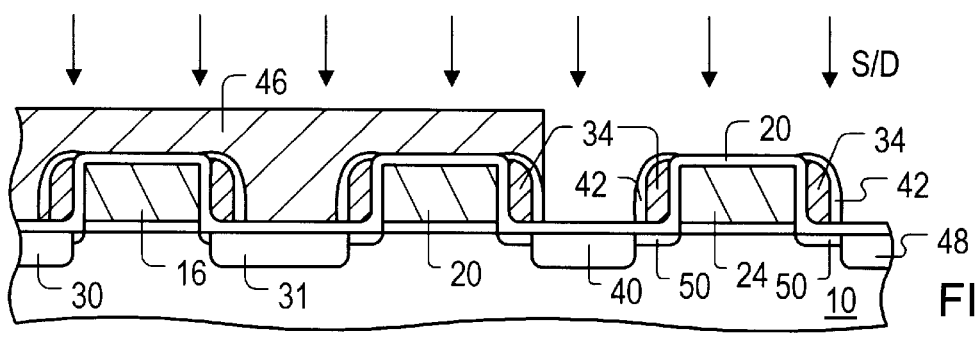
FIG. 9 depicts a cross-sectional view of the semiconductor topography, wherein a S/D implant is forwarded exclusively into regions of the substrate that are a spaced distance form the third gate conductor, thereby forming S/D regions therein.

FIG. 8 depicts the removal of masking layer 38 followed by the formation of additional spacers 42 laterally adjacent to spacers 34. Spacers 42 may be formed by the deposition of an insulating material, such as oxide that is different from the material used to make, e.g., nitride-based spacers 34. A portion 44 of this insulating material may be etched away anisotropically to form spacers 42. Alternately, spacers 34 may be removed and thicker spacers may be formed in their place from the same material as spacers 34. Each layer of spacer material is preferably different from an underlying layer of material so that individual layers may be exclusively removed from the underlying layer using a wet etch. Preferably, the thickness of each of the spacers 42 is about 25 to 150 Å. Turning to FIG. 9, a photoresist masking layer 46 is then formed across gate conductors 16 and 20 and their adjacent spacer layers. A S/D implant is forwarded into exposed regions of substrate 10 that is self-aligned to the exposed lateral surfaces of spacers 42 nearest to gate conductor 24. Thus, previously formed S/D region 40 is extended laterally such that it is interposed between spacer 34 that is nearest gate conductor 20 and spacer 42 that is nearest gate conductor 24. The resulting implant region 40 is mutually shared between the two adjacent transistors. Further, portions of previously formed LDD areas 26 that do not become converted to S/D regions 40 and 48 are shown as LDD areas 50. LDD areas 50 are interposed between gate conductor 24 and S/D regions 40 and 48. The length of each LDD area 50 is equivalent to the combined thicknesses of insulating material 20, spacer 34, and spacer 42.

Figure 10:
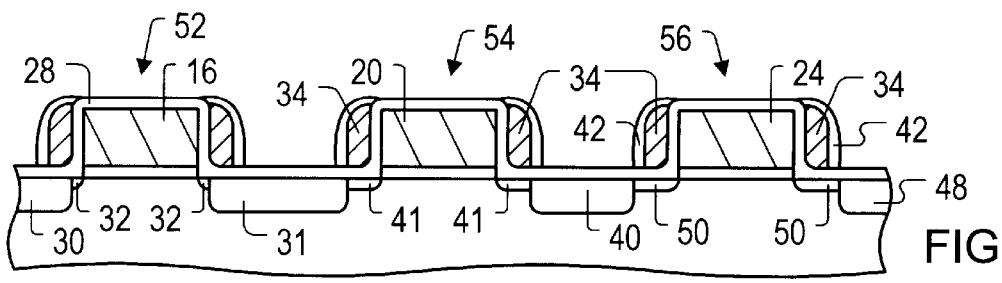
FIG. 10 depicts a cross-sectional view of the resulting test structure, according to one embodiment of the present invention, wherein the test structure includes three transistors that have different configurations for their LDD areas.

FIG. 10 depicts the test structure that results from the steps shown in FIGS. 1–9. The test structure contains three transistors 52, 54, and 56 which all have the same gate lengths. However, the three transistors are strategically fabricated such that they have graded junctions with varying LDD lengths. The LDD length for each transistor is dictated by the thickness of material lying adjacent to the gate conductor of the respective transistor during the formation of the S/D implants for that transistor. Additional transistors may also be formed that lie in the same plane as transistors 52, 54, and 56 for use in the test structure. Such additional transistors may be configured to have further differing LDD lengths from the already existing transistors by varying the thickness of each spacer pair for as many transistors as needed to fully characterize LDD areas.

The completed test structure may be used to compare the characteristics of the transistors employed by the test structure. Since the transistors have different LDD lengths, it may be possible to determine the effect that LDD length has on transistor performance. Further, it may be possible to find the optimum LDD length for a transistor having a certain gate length. In order to characterize the transistors of FIG. 10, power may be applied to the source of each transistor and a voltage reading may be made from the drain of each transistor. In one embodiment, region 30 may function as the source of transistor 52, and region 31 may function as the drain of transistor 52. Further, since region 31 mutually shared by transistor 54, region 31 may function as the source of transistor 54, and region 40 may function as the drain. Region 40 may then function as the source of transistor 56, and region 48 may function as the drain. To make an n-channel transistor of the test structure reach saturation, the source-coupled voltage may be at ground and the gate-coupled voltage may be at VDD or at least one threshold above ground. To make a p-channel transistor reach saturation, the source-coupled voltage may be at VDD and the gate-coupled voltage may be at ground or at least one threshold below VDD.

Applying a specific voltage upon the gate and source areas to achieve an expected drain performance parameter is but one possible use of the present test structure. If the transitional voltage/current upon the drain occurs slower (or is less in magnitude) than an expected speed/amount, then it may be necessary to, e.g., reduce the LDD length and/or increase the transistor drive strength. By using multiple, series-coupled transistors, each with a specific LDD length, one of the transistors may demonstrate optimal speed/ voltage outcome while the others may not. The multiple transistors can not only be readily processed according to a normal processing flow, but also can provide a platform for testing multiple LDD lengths concurrently, if necessary. From concurrent testing, an optimal transistor can be selected from the transistor grouping.

It will be appreciated to those skilled in the art having the benefit of this disclosure that this invention is believed to provide a method for forming a test structure that may be used to find the optimum transistor LDD length. It is intended that the following claims be interpreted to embrace all such modifications and changes and, accordingly, the specification and drawings are to be regarded in an illustrative rather than a restrictive sense.

What is claimed is:

1. A transistor test structure, comprising:
   a first polysilicon gate conductor bound between a first pair of sidewall surfaces, said first gate conductor being disposed above a semiconductor topography;
   a second polysilicon gate conductor laterally spaced from said first gate conductor, said second gate conductor being bound between a second pair of sidewall surfaces, said second gate conductor being disposed above said semiconductor topography;
   a first spacer material disposed upon said first pair of sidewall surfaces and said second pair of sidewall surfaces, said first spacer material having a first pre-defined thickness;
   a second spacer material arranged laterally adjacent to said first spacer material, said second spacer material having a second pre-defined thickness;
   first source and drain regions of said first gate conductor arranged within said semiconductor topography a first spaced distance from said first gate conductor, said first spaced distance being defined by said first pre-defined thickness;
   second source and drain regions of said second gate conductor arranged within said semiconductor topography a second spaced distance from said second gate conductor, said second spaced distance being defined by said first predefined thickness combined with said second pre-defined thickness,
   wherein one of said first source and drain regions contacts one of said second source and drain regions to form a mutual implant region between said first gate conductor and said second gate conductor.

2. The transistor test structure of claim 1, further comprising a first pair of lightly doped drain regions disposed within said semiconductor topography between said first gate conductor and said first source and drain regions.

3. The transistor test structure of claim 1, further comprising a second pair of lightly doped drain regions disposed within said semiconductor topography between said second gate conductor and said second source and drain regions.

4. The transistor test structure of claim 1, further comprising a third polysilicon gate conductor laterally spaced from said second gate conductor, said third gate conductor being bound between a third pair of sidewall surfaces, said third gate conductor being disposed above said semiconductor topography.

5. The transistor test structure of claim 4, further comprising a third spacer material arranged laterally adjacent to said second spacer material, said third spacer material having a third pre-defined thickness.

6. The transistor test structure of claim 5, further comprising third source and drain regions of said third gate conductor arranged within said semiconductor topography a third spaced distance from said third gate conductor, said third spaced distance being defined by said first pre-defined thickness combined with said second pre-defined thickness combined with said third pre-defined thickness.

7. The transistor test structure of claim 5, wherein said first pre-fined thickness is approximately 50 to 300 Å.

8. The transistor test structure of claim 5, wherein said second pre-defined thickness is approximately 100 to 500 Å.

9. The transistor test structure of claim 5, wherein said third pre-defined thickness is approximately 25 to 150 Å.

10. A transistor test structure, comprising:
    a first transistor having a first channel area and a first pair of lightly doped drain areas each extending a first spaced distance from the first channel area; and
    a second transistor having a second channel area and a second pair of lightly doped drain areas each extending a second spaced distance from the second channel area, wherein the first spaced distance is less than the second spaced distance,
    wherein the first and second lightly doped drain areas are separated by a source region or a drain region that interconnects the first transistor in series with the second transistor.

11. The transistor test structure as recited in claim 10, wherein the first and second lightly doped drain areas extend within an upper surface of a silicon substrate.

12. The transistor test structure as recited in claim 10, wherein the first lightly doped drain area extends beneath one or more spacers having a cumulative first thickness less than a cumulative second thickness of one or more spacers which reside above the second lightly doped drain area.

13. The transistor test structure as recited in claim 12, wherein the first thickness is approximately 50 to 300 Å.

14. The transistor test structure as recited in claim 12, wherein the second thickness is approximately 100 to 500 Å.

15. The transistor test structure as recited in claim 10, wherein the first and second lightly doped drain areas are of the same impurity type.

16. The transistor test structure as recited in claim 10, further comprising means for testing the first and second lightly doped drains areas concurrently.

* * * * *